United States Patent [19]
Pascucci et al.

[11] Patent Number: 5,754,483
[45] Date of Patent: May 19, 1998

[54] REFERENCE WORD LINE AND DATA PROPAGATION REPRODUCTION CIRCUIT FOR MEMORIES PROVIDED WITH HIERARCHICAL DECODERS

[75] Inventors: Luigi Pascucci, Sesto San Giovanni; Paolo Rolandi, Voghera; Marco Fontana, Milan; Antonio Barcella, Trescore Balneario, all of Italy

[73] Assignee: SGS-Thomson Microelectronics S.r.l., Agrate Brianza, Italy

[21] Appl. No.: 835,033

[22] Filed: Mar. 27, 1997

[30] Foreign Application Priority Data

Mar. 29, 1996 [EP] European Pat. Off. ............. 96830160

[51] Int. Cl.$^6$ .................................................. G11C 7/00
[52] U.S. Cl. ...................................... 365/194; 365/210
[58] Field of Search ................................ 365/194, 210, 365/230.03, 230.06

[56] References Cited

U.S. PATENT DOCUMENTS

| | | | |
|---|---|---|---|
| 4,520,466 | 5/1985 | Mashiko | 365/210 |
| 4,792,928 | 12/1988 | Tobita | 365/210 |
| 4,811,290 | 3/1989 | Watanabe | 365/149 |
| 4,982,364 | 1/1991 | Iwahashi | 365/189.09 |
| 5,010,518 | 4/1991 | Toda | 365/210 |
| 5,031,153 | 7/1991 | Suyama | 365/206 |

OTHER PUBLICATIONS

European Search Report from European Patent Application No. 96830160.6, filed Mar. 29, 1996.
IBM Technical Disclosure Bulletin, vol. 28, No. 7, Dec. 1985, New York, US, pp. 3022–3024, "Sense Amplifier Set Signal Generation".
IBM Technical Disclosure Bulletin, vol. 33, No. 4, Sep. 1990, New York, US, pp. 257–258, "Sense Amplifier Set Control".
Patent Abstracts of Japan, vol. 18, No. 638 (P–1837), Dec. 5, 1994 & JP–A–06 243691 (Watanabe).
Patent Abstracts of Japan, vol. 9, No. 48 (P–338), Feb, 28, 1985 & JP–A–59 185089 (Hitachi).

*Primary Examiner*—David C. Nelms
*Assistant Examiner*—Son Mai
*Attorney, Agent, or Firm*—Wolf, Greenfield & Sacks, P.C.

[57] ABSTRACT

A reference word line and data propagation reproduction circuit, particularly for non-volatile memories provided with hierarchical decoders, where the memory is divided into at least two memory half-matrices that are arranged on different half-planes. The circuit includes, for each one of the at least two memory half-matrices, a reference unit for each one of the at least two memory half-matrices and an associated unit for reproducing the propagation of the signals along the reference unit. The reference unit and the associated propagation reproduction unit have a structure that is identical to each generic word line of the memory device. The reference and propagation reproduction units of one of the at least two memory half-matrices are activatable upon selection of a memory cell in the other one of the at least two memory half-matrices, in order to provide a reference that is synchronous and symmetrical with respect to the selection of the memory cell for reading it and so as to preset, according to the propagation reproduction unit conditions for starting correct and certain reading of the selected memory cell.

27 Claims, 4 Drawing Sheets

REFERENCE WORD LINE AND DATA PROPAGATION REPRODUCTION CIRCUIT FOR MEMORIES PROVIDED WITH HIERARCHICAL DECODERS

BACKGROUND OF THE INVENTION

1. Field of the Invention

The present invention relates to a reference word line and data propagation reproduction circuit, particularly for non-volatile memories provided with hierarchical decoders. More particularly, the invention also relates to synchronization of said reference word lines for a memory device provided with hierarchical decoders.

2. Discussion of the Related Art

In a memory device that includes two half-matrices of memory cells, hierarchical decoders are advantageously used which drive portions of a word line and are stimulated by local decoding operations, all of which are stimulated by a single main line that branches out of a main decoder.

Considering, for example, a generic memory with a 16-bit word length, each bit includes a packet of bit lines (which belong to the same bit) and a reference bit line.

In this manner, therefore, there are sixteen reference bit lines, one for each of the sixteen outputs of a memory device, and this occupies a considerable amount of space in a memory device.

A multiplexer is usually used for bit line selection, whereas reference line selection requires a single transistor. The multiplexer introduces a significant capacitance, which is significantly different from the single capacitance introduced by the single transistor of each reference bit line.

In this case, a dynamic comparison of the current of a selected memory cell with the current of a reference cell to determine the status of the first cell can be impaired by this difference in capacitance. Recovery of the asymmetry also introduces delays.

Furthermore, locating the bit line far from the matrix bit line that is actually selected for reading has a drawback in that the signals that are present on the reference line and on the read line can be different, due to the different distances from the activation point, in view of the lack of symmetry of the reference line and of the bit line with respect to the activation point.

SUMMARY OF THE INVENTION

An aim of the present invention is therefore to provide a reference line and a data propagation reproduction circuit, particularly for non-volatile memories provided with hierarchical decoders, that has a smaller number of reference lines than conventional embodiments.

Within the scope of this aim, a further object of the present invention is to provide a reference line and data propagation reproduction circuit that provides a correspondence between the propagation of a generic word line and a reference line.

An additional object of the present invention is to provide a reference line and data propagation reproduction circuit that avoids current consumptions entailed by voltage boost lines.

Another object of the present invention is to provide a reference line and data propagation reproduction circuit that presets conditions for starting a correct reading step.

Another object of the present invention is to provide a reference line and data propagation reproduction circuit that allows harmonization of the various power supply combinations that are present in the system.

Another object of the present invention is to provide a reference line and data propagation reproduction circuit that are capable of synchronously setting the activation/deactivation times of the data propagation selection functions.

Another object of the present invention is to provide a reference line and data propagation reproduction circuit that allows rapid restoration of the inactive condition of the reference so that it is ready for a new reading operation, even if it is an immediate one.

Another object of the present invention is to provide a reference line and data propagation reproduction circuit that are highly reliable and relatively easy to produce at competitive costs.

This aim, these objects, and others that will become apparent hereinafter are achieved, in a memory device, by a reference word line and data propagation reproduction circuit, particularly for non-volatile memories provided with hierarchical decoders, wherein said memory is divided into at least two memory half-matrices that are arranged on different half-planes, and in that said circuit includes, for each one of said at least two memory half-matrices, a reference unit for each one of said at least two memory half-matrices and an associated unit for reproducing propagation of signals along said reference unit, said reference unit and said associated propagation reproduction unit, each having a structure that is identical to each generic word line of the memory device, the reference and propagation reproduction units of one of said at least two memory half-matrices being activatable upon selection of a memory cell in the other one of said at least two memory half-matrices, in order to provide a reference that is synchronous and symmetrical with respect to the selection of said memory cell for reading it and so as to preset, according to the propagation reproduction unit, the conditions for starting correct and certain reading of said selected memory cell.

Another embodiment of the present invention is a method for reading a memory device, including the steps of selecting a memory cell of a word line in one of at least two memory half-matrices into which said memory device is divided and selecting, in a reference unit, a virgin reference memory cell that is connected to a bit line that positionally matches the selection of said memory cell, but which is located in a domain of an other one of said at least two memory half-matrices. Further, activating, simultaneously with said reference memory cell, a propagation delay reproduction unit to reproduce the propagation delay of said word line and of said reference unit; and detecting an end of said propagation delay to determine a moment of activation of circuits for reading said memory device.

In another embodiment of the present invention, a reference word line and data propagation reproduction circuit includes a first selection/deselection circuit having a first output and a first reference line coupled to the first output of the first selection/deselection circuit. A first propagation delay reproduction line is coupled to the first output of the first selection/deselection circuit and a propagation delay selecting circuit is coupled to the first propagation delay reproduction line. Finally, a propagation end detecting circuit is coupled to the propagation delay selecting circuit.

BRIEF DESCRIPTION OF THE DRAWINGS

Further characteristics and advantages of the invention will become apparent from the description of a preferred but not exclusive embodiment of the circuit according to the invention, illustrated by way of non-limitative examples in the accompanying drawings, wherein.

DETAILED DESCRIPTION

With reference to the above figures, the circuit according to the present invention comprises a memory matrix that is divided into at least two half-matrices (not shown). Each half-matrix is divided into further matrix subsections to be driven by hierarchical decoders.

In the case shown in the figures, the memory device is divided into two half-matrices and each half-matrix is divided into four matrix subsections.

Each half-matrix has a reference line that is provided with characteristics that are similar to the generic word line of the half-matrix.

The reference lines (one for each half-matrix) are also each divided into four segments that correspond to the segments into which the generic word line is divided.

Figure 1:
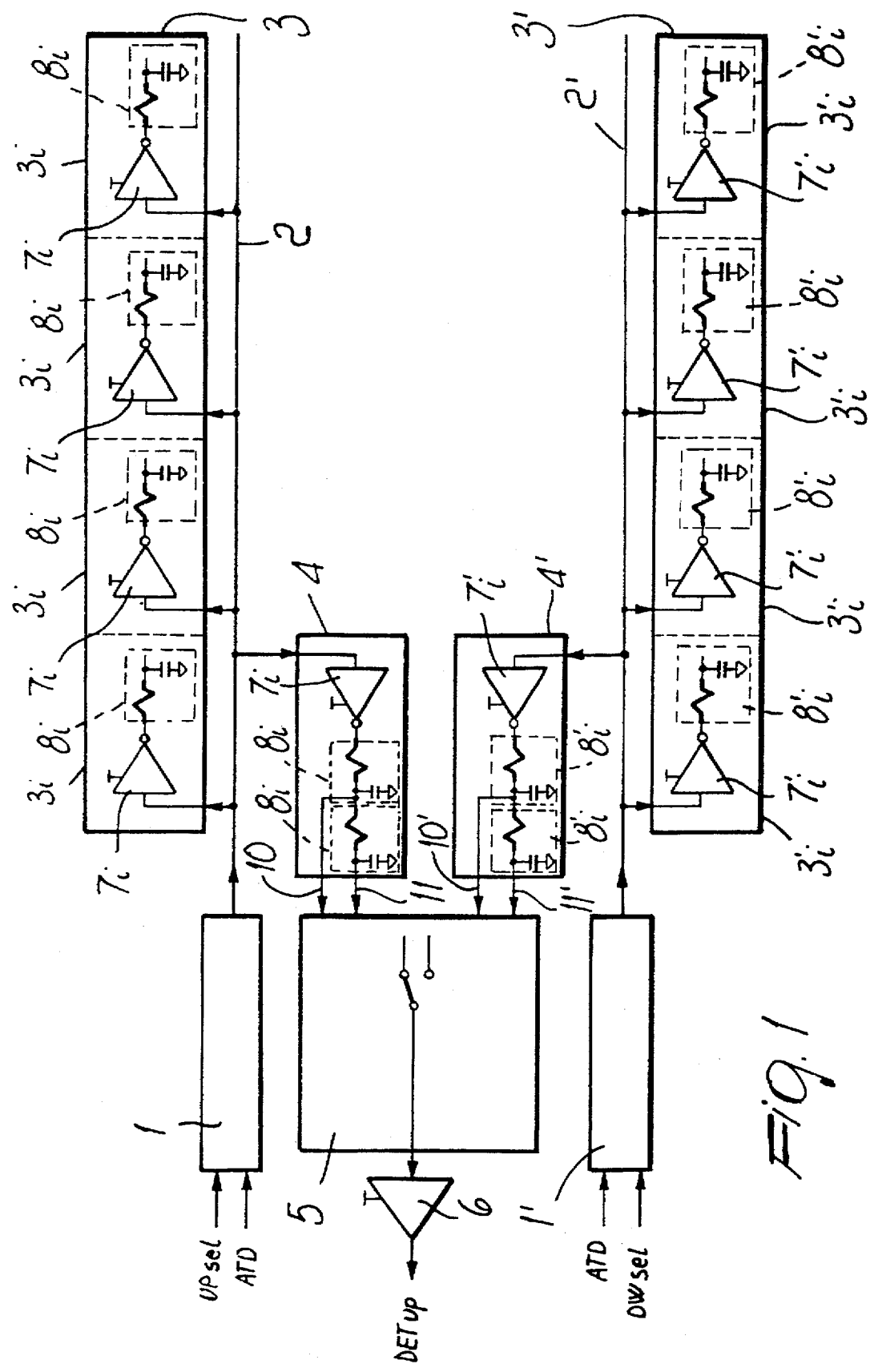
FIG. 1 is a block diagram of the circuit according to the present invention.

FIG. 1 illustrates the general architecture of the circuit according to the present invention, in which both reference lines are shown. It is clear that the circuit is symmetrical as regards a reference line located on one half-plane (half-plane of a half-matrix) and the reference line located on an opposite half-plane. Because of this, hereinafter the following description will refer to a single reference line, since any remark must be understood to apply automatically to the other reference line as well. The reference numerals used will also be identical, with the only difference that the reference numerals of one of the two reference lines will be primed.

In FIG. 1, the reference numeral 1 designates a selection/deselection circuit that is driven by a signal UPsel, likewise, there is a signal DWsel for selection/deselection circuit 1', and by a read address transition signal ATD for stimulating a line 2 that is adapted to activate the various segments of which the reference line is composed.

Said segments of the reference line are designated by $3_i$ (where i=1 . . . n, in this case i=1 . . . 4). Hereinafter, the reference line will be generically designated by the reference numeral 3.

The selection/deselection circuit 1 forms, for all practical purposes, a hierarchical decoder that allows one to balance the capacitances of a decoder of the word lines of the memory half-matrices.

The memory cells of the reference line 3 are virgin, so as to constitute a reference for the matrix cells of a generic word line selected for reading. Said virgin memory cells are connected to the corresponding bit lines of the half-matrix in which the reference line 3 is located.

An additional propagation delay reproduction line 4, adapted to reproduce a propagation delay of a signal along a generic word line, has a structure that is similar to a segment $3_i$ of the reference line 3. A single segment is used as the additional propagation delay reproduction line 4 because the delay of one segment $3_i$ is sufficient to determine the propagation delay of the entire line 3, since it is constituted by a known number of mutually identical segments $3_i$.

The memory cells of the additional propagation delay reproduction line 4 are disconnected from the corresponding bit lines of the half-matrix in which said reference line 3 is located, since the conductivity of these memory cells is irrelevant.

The additional propagation delay reproduction line 4 is activated by the same line 2 driven by the selection/deselection circuit 1.

An output of the additional propagation delay reproduction line 4 is received by a circuit 5 for selecting the propagation delay generated by the additional propagation delay reproduction line 4.

The propagation delay selection circuit 5 sends a propagation delay signal to a circuit 6 for detecting an end of propagation along said reference line 3, which reproduces a generic word line of the memory matrix.

The end of propagation detecting circuit 6 is conveniently provided, for example, by a trigger.

The propagation delay selection circuit 5 is adapted to select an output point of said additional propagation delay reproduction line 4, which can be an intermediate point or an end point according to the operating requirements.

All of the above description also applies to the reference line 3' that lies on the half-plane that is opposite to the half-plane of the reference line 3.

Figure 2:
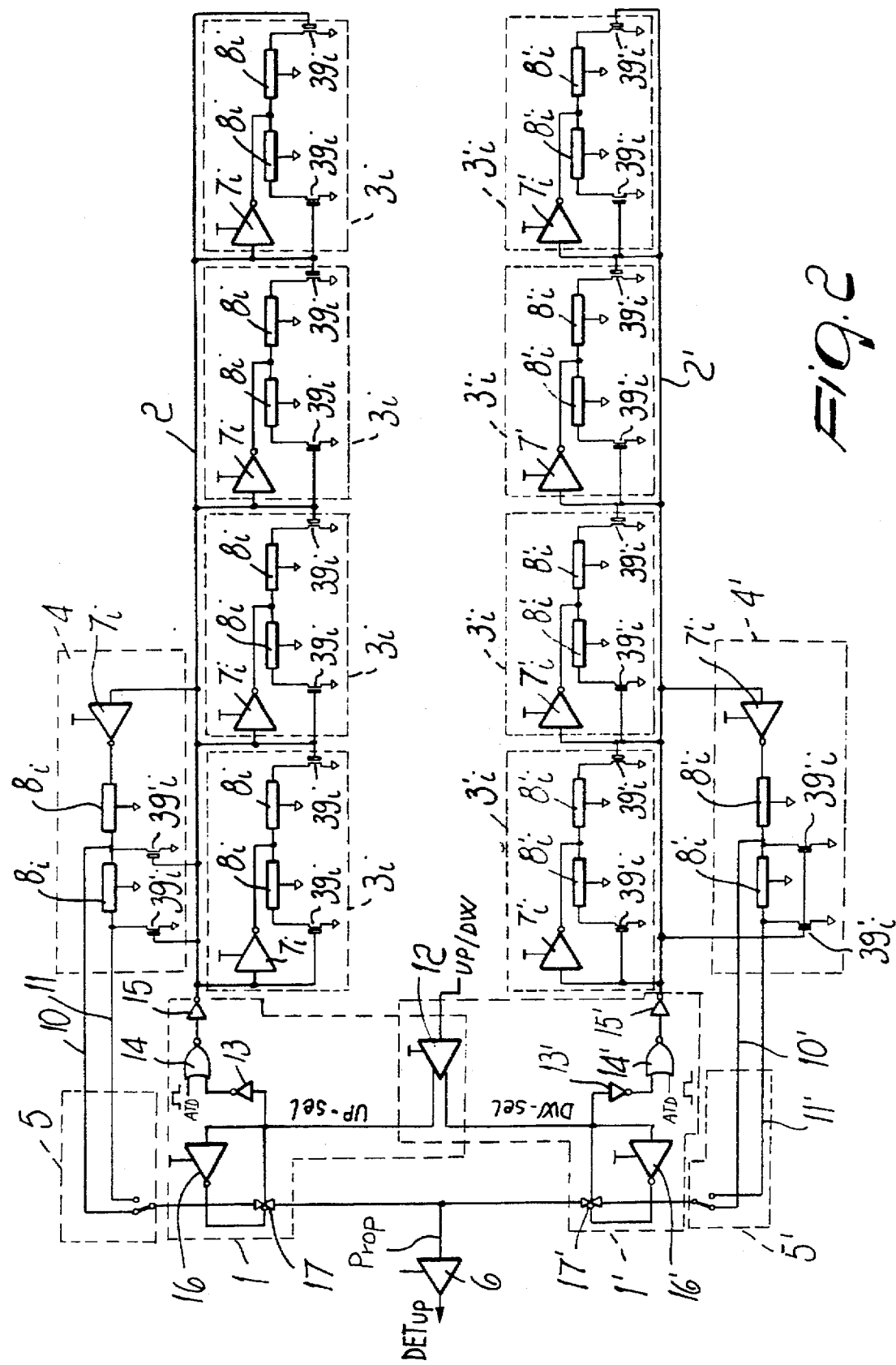
FIG. 2 is a detailed circuit diagram of the circuit according to the present invention.

With reference to FIG. 2, the architecture shown in FIG. 1 is shown in more circuital detail.

Each segment $3_i$ of the reference line 3 (and therefore of the reference line 3' as well) includes a driver, which is advantageously provided by an elevator structure $7_i$, followed by an RC network $8_i$. The RC network $8_i$ is composed of a plurality of RC circuits that are series-connected to each other. The RC network $8_i$ represents a delay that is similar to the one that exists in the generic word line.

The hierarchical decoder I reduces the propagation of a generic word line with distributed capacitances. If all the capacitances of the line were series-connected, one would in fact have a highly capacitive line with propagation delays.

The elevator structure $7_i$ drives an intermediate point of the line that comprises the plurality of RC networks $8_i$, thus improving propagation.

Figure 4:
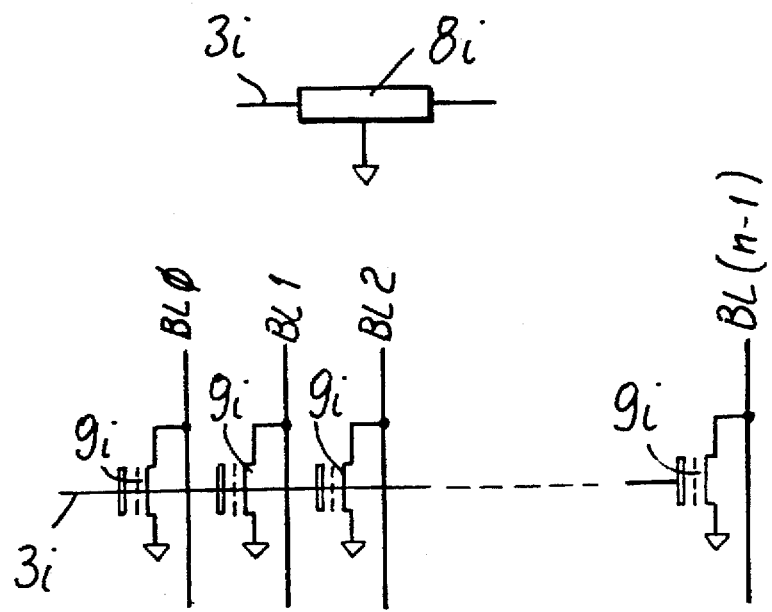
FIG. 4 is a detailed view of a configuration of the bit lines of the memory device.

The memory cells of the reference line 3, which are virgin, are designated by $9_i$ and are shown, in FIG. 4, connected to the corresponding bit lines (designated by BL0, BL1, BL2, . . . , BL(n-1)). Said virgin memory cells are conveniently provided by floating-gate transistors.

The virgin memory cells of the additional propagation delay reproduction line 4 are instead not connected to the bit lines.

The RC structures $8_i$ of the reference line 3 and of the additional propagation delay reproduction line 4 are conveniently connected to ground by virtue of a circuit for restoring the pre-activation conditions. Said preactivation restoring circuit is advantageously provided by transistors $39_i$ that are adapted to rapidly restore the pre-activation conditions of the reference line 3 and of the additional propagation delay reproduction line 4.

The elevator structures $7_i$ are supplied with a supply voltage that is actually present in the memory device (voltage $V_{DD}$ or boost voltage).

The propagation delay reproduction line 4 likewise has a structure that is identical to each segment $3_i$ of the reference line 3 and is therefore also provided with an elevator structure $7_i$ that is also supplied with the voltage that is actually present in the memory device.

The output of the propagation delay reproduction line 4 for reproducing the propagation delays of a generic word line is selected by the propagation delay selection circuit 5. Therefore, if a delay taken at an intermediate point of the line 4 is selected, one obtains, in output, the line 10, whereas if a delay taken at an end of the line 4 is selected, then one obtains, in output, the line 11.

In detail, the selection/deselection circuit 1 comprises an elevator structure 12 that is common both to the selection/deselection circuit 1 and to the selection/deselection circuit 1'. The elevator structure 12 is supplied with the supply voltage that is actually present in the memory device, and receives, as an input, the signal UP/DW for selecting reference line $3_i$ or reference line $3_i'$.

The output of the elevator structure 12 is constituted by the two signals UPsel and DWsel for selection of the two reference lines $3_i$ and $3_i'$, respectively.

The selection/deselection circuit 1, with which the signal UPsel is associated, will now be described in detail. Similar remarks apply to the selection/deselection circuit 1' with which the signal DWsel is associated.

The signal UPsel output from the elevator structure 12 is therefore sent as an input, through an inverter 13, to a NOR gate 14.

The other input of the NOR gate 14 receives the read address transition detection signal ATD. The output of the NOR gate 14 is in turn sent, through an inverter 15, so as to drive the activation line 2 of the reference line 3 (therefore each segment $3_i$ of the reference line 3).

The signal UPsel is also sent as an input to an additional elevator structure 16, whose output is sent as an input to a gate terminal of a P-channel transistor of a pair of pass transistors 17. The signal UPsel is sent to a gate terminal of an N-channel transistor of the same pair of pass transistors 17.

The two pass transistors 17 are interposed between the lines 10 and 11 that exit from the propagation delay reproduction line 4 and the circuit 6 for detecting the end of propagation along said reference lines, which reproduce the propagation along a generic word line of the memory matrix. The propagation end detection circuit 6 therefore receives, as an input, a propagation indication signal PROP and outputs a detection signal DETup.

The detection circuit 6 is also supplied with the supply voltage that is actually present in the memory device ($V_{DD}$ or boost).

Figure 3:
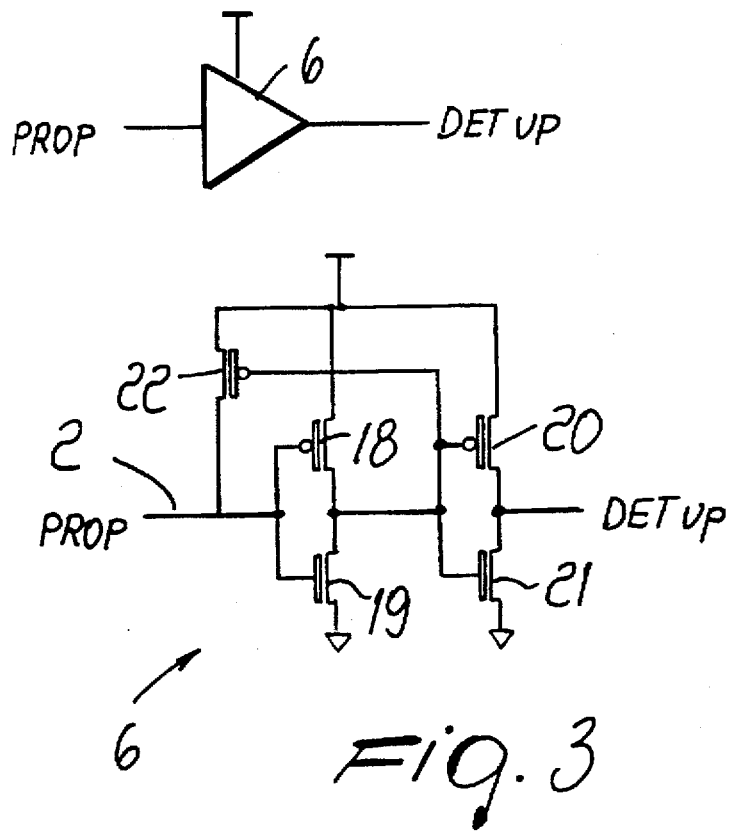
FIG. 3 is a circuit diagram of a trigger for setting the trigger level in order to determine an end of precharging.

With reference to FIG. 3, said detector circuit 6 is shown in its circuital details and is advantageously constituted by a trigger.

The trigger comprises a first complementary MOS inverter and a second complementary MOS inverter. The first inverter comprises a P-channel transistor 18 and an N-channel transistor 19, which are common-drain connected, and the second inverter comprises a P-channel transistor 20 and an N-channel transistor 21 that are common-drain connected. The trigger is completed by a further P-channel transistor 22.

The signal PROP is sent to the gate terminals of the transistors 18 and 19. The drain terminals of the transistors 18 and 19 are connected to the gate terminal of the transistor 22 and to the gate terminals of the transistors 20 and 21. The source terminals of the transistors 18, 22, and 20 are connected to the supply voltage (which can be $V_{DD}$ or a boost voltage) and the source terminals of the transistors 19 and 21 are connected to ground. The drain terminal of the transistor 22 is connected to the gate terminals of transistors 18 and 19. The output of the trigger is taken at the common drain terminals of the transistors 20 and 21 and is the signal DETup.

Figure 5:
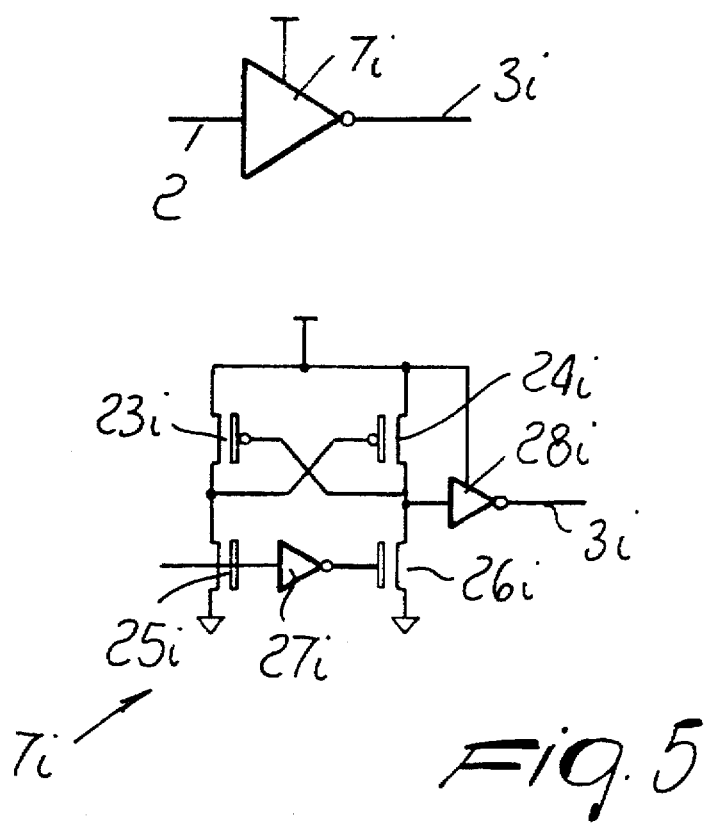
FIG. 5 is a view of an activation circuit of the reference lines.

FIG. 5 shows in detail the elevator structure $7_i$, which comprises two P-channel transistors $23_i$ and $24_i$ whose source terminals are connected to the supply voltage (which can correspond to the boost voltage) and whose respective drain terminals are connected to the drain terminals of an N-channel transistor $25_i$ and of an N-channel transistor $26_i$, respectively.

The gate terminals of the transistors $23_i$ and $24_i$ are connected, respectively, to the common-drain connection of the transistors $24_i$–$26_i$ and transistors $23_i$–$25_i$. The source terminals of the transistors $25_i$ and $26_i$ are connected to ground.

An inverter $27_i$ is interposed between the gate terminals of the transistors $25_i$ and $26_i$. The activation line 2 is sent as an input to the gate terminal of the transistor $25_i$ and the inverse of the activation line 2 is provided to the gate terminal of the transistor $26_i$ by the output of the inverter $27_i$.

An additional inverter $28_i$ is series-connected to the output of the elevator structure $7_i$, taken at the common-drain connection of the transistors $24_i$ and $26_i$. The signal output from the inverter $28_i$ is the signal for driving the line $3_i$. This elevator structure $7_i$ is repeated for each segment $3_i$ into which the reference line 3 is divided.

Figure 6:
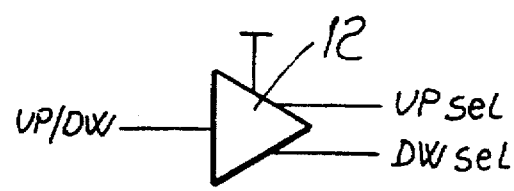
FIG. 6 is a view of the selection circuit of a reference line that belongs to a given left or right half-matrix.
Figure 6:
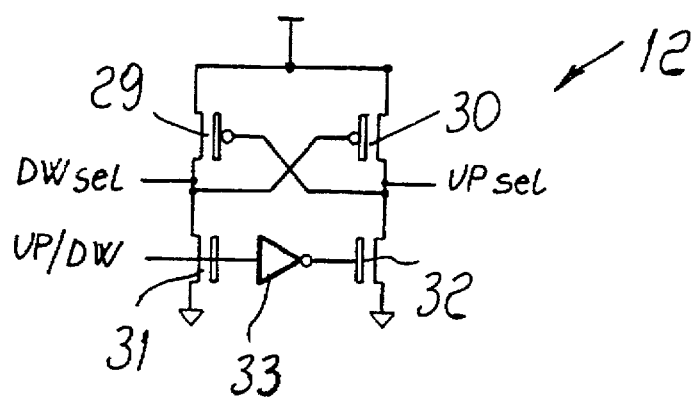

FIG. 6 is a view of the elevator structure 12, which is similar to the elevator structure $7_i$. Therefore, this structure is not described in detail to avoid redundancy in description. The correspondence between the elements of the elevator structure $7_i$ and the elements of the elevator structure 12 is determined as follows.

The transistors $23_i$, $24_i$, $25_i$, and $26_i$ of the structure $7_i$ functionally correspond to the transistors 29, 30, 31, and 32, respectively, of the elevator structure 12.

As in the elevator structure $7_i$, in the elevator structure 12 there is an inverter 33 (which corresponds to the inverter $27_i$). The inverter $28_i$ of the structure $7_i$ is not present in the structure 12.

With reference to the above figures, the operation of the circuit according to the present invention is as follows.

When the pulsed read address transition signal ATD switches from high to low, if one of the selection signals of one of the two half-matrices, i.e., the signals UPsel and DWsel, is low, for example, UPsel, then the output signal from inverter 13 is high, and the NOR gate 14 emits a low signal. This low signal is inverted in the inverter 15, so as to drive the activation line 2, activating the segment $3_i$ of the reference line 3, where a virgin memory cell $9_i$ is present that positionally corresponds to the memory cell of a generic word line selected for reading.

Selection of the virgin reference cell occurs in the matrix half-plane that is opposite to the one in which the memory cell to be read is selected.

In this manner, reference activation is synchronous and symmetrical with respect to the selection of a memory cell, and the comparison of the memory cell with a corresponding reference cell $9_i$ that belongs to the reference line 3 allows one to determine the status of the memory cell to be read.

Simultaneously with the activation of the reference line 3, the associated propagation delay reproduction line 4 is activated so as to assuredly establish the end of the propagation of the signals along the reference line 3. This propagation corresponds, for the structure of the reference line 3 (which is identical to the structure of a generic word line of each half-matrix), to the propagation of a generic word line.

The output of the propagation delay reproduction line 4 can be optionally selected at an intermediate point of the line, at an end point thereof, or at a point determined by the OR combination of the intermediate point and of the end point. In the first case, presetting for fast reading is performed, whereas in the second case presetting for slow reading occurs and the third case is used for test reading.

An advantage of having a hierarchical decoder that drives line segments instead of the entire line at once lies in the fact that the partial activation of a generic word line allows one to provide faster read times.

The drivers of the various segments $3_i$ of the reference line 3 are advantageously provided by elevator structures $7_i$ to avoid useless tapping of the boost line.

It is evident that the activation of the reference line 3 and of the propagation delay reproduction line 4 occurs synchronously with the end of the signal ATD and is therefore tied, in terms of time, to the selection of a memory cell in a generic word line.

The deselections (resets) of the reference line 3 and of the propagation reproduction line 4 occur by use of the transistors $39_i$ and are fast.

The positional match of the activation points of said lines allows equal propagation of the signals, since equidistance from the activation points is provided.

The signals UPsel and DWsel are generated by the elevator structure 12, which receives the signal UP/DW as input.

The output of the propagation delay selection circuit 5 (adapted to select the intermediate point, the end point, or their OR, of the propagation delay reproduction line 4) is sent to the propagation end detection circuit 6, which is constituted by a trigger which, by tripping, presets the activation of the read circuits, emitting the signal DETup as an output.

Reading activation is provided assuredly, since it is closely tied, in terms of time, to the propagation conditions of the signals along the word line selected for reading, and is furthermore tied to the supply level that occurs at that moment.

The circuit according to the present invention entails a correlation to the power supplies that are actually present in the memory device and by means of which the word lines are activated. Both in the case of a normal power supply $V_{DD}$ and in the case of a supply with a boost voltage, the elevator structures 7, 12 that are present in the circuit can be supplied with the supply voltage that is actually present in the memory device ($V_{DD}$ or boost).

In practice it has been observed that the circuit according to the present invention fully achieves the intended aim and objects, since it provides two reference lines that are structurally identical to a generic word line and are arranged so that one is in one memory half-matrix and the other is in the opposite half-matrix. In this manner, the selection of a generic memory cell that belongs to a bit line in a memory half-matrix is matched by the synchronous selection of a virgin reference memory cell that positionally matches the bit line to which said selected memory cell belongs, but is arranged in the domain of the opposite half-matrix.

The reference thus provided allows determination of the status of a memory cell involved in a reading operation.

The circuit according to the present invention also entails providing a line for reproducing the propagation of the signal both in said reference line and in a generic word line in which the memory cell to be read is selected.

The determination of the end of propagation establishes the moment of activation of the read circuits as a consequence of the certain attainment of the conditions for correct reading, such as the propagation of the word lines.

The correspondence between the activations (of the word line and of the reference line) in the two half-matrices and the propagation line is due to them being equidistant from the activation points, since the reference is activated so as to positionally match the selected memory cell.

Furthermore, the provision of just two reference lines, one for each half-matrix, drastically reduces the number of necessary reference lines, i.e., sixteen in a similar memory device provided according to a conventional architecture.

The provision of a reference line that is similar to a generic word line reproduces the capacitive loads of the generic word line, allowing actual synchronization of the reference with the word line affected by the reading operation.

Finally, the circuit according to the present invention provides for harmonization with the various operating voltages that are present in the memory device, providing a lock on the actual voltage that is used (normal or boost voltage), and the circuital solutions eliminate current consumptions, which are negative for boost lines.

The circuit thus conceived is susceptible of numerous modifications and variations, all of which are within the scope of the inventive concept.

Thus, for example, it is possible to divide the memory matrix into a number of memory half-matrices other than two. In this case, also, for each half-matrix there must be a reference line 3 and an associated propagation delay reproduction line 4.

In turn, each half-matrix can be divided into any number of half-matrix subsections, which are matched by an equal number of segments of the reference line 3.

Finally, all the details may furthermore be replaced with other technically equivalent elements.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A reference word line and data propagation reproduction circuit for use with a memory device, the memory being divided into at least two memory half-matrices that are arranged on different half-planes, the data propagation reproduction circuit comprising:

for each one of said at least two memory half-matrices, a reference unit for each one of said at least two memory half-matrices and an associated unit for reproducing propagation delay of signals along said reference unit, said reference unit and said associated propagation delay reproduction unit having a structure that is identical to each generic word line of the memory device, the reference and propagation reproduction units of one of said at least two memory half-matrices being activatable upon selection of a memory cell in the other one of said at least two memory half-matrices, in order to provide a reference that is synchronous and symmetrical with respect to the selection of said memory cell for reading it and so as to preset, according to the propagation delay reproduction unit, conditions for starting correct and certain reading of said selected memory cell.

2. The circuit according to claim 1, wherein said reference unit and said propagation delay reproduction unit are arranged in a half-plane of each one of said at least two memory half-matrices.

3. The circuit according to claim 1, wherein said reference unit and said propagation delay reproduction unit comprise, respectively, a reference word line and a propagation delay reproduction line, said reference word lines and propagation reproduction lines being structurally identical to a generic word line of said memory device.

4. The circuit according to claim 1, wherein said reference unit comprises a plurality of virgin memory cells, said virgin memory cells being connected to the corresponding bit lines of the half-matrix in which said reference unit is located.

5. The circuit according to claim 1, wherein said propagation delay reproduction unit comprises a plurality of virgin memory cells, said virgin memory cells being disconnected from the bit lines of the memory half-matrix in which said propagation delay reproduction unit is located, said propagation delay reproduction unit to synchronously reproduce propagation delay of said reference unit and of the associated word line as a consequence of a selection of a memory cell for reading said memory cell.

6. The circuit according to claim 1, wherein each one of said memory half-matrices is divided into a plurality of memory half-matrix subsections, to be driven by hierarchical decoders.

7. The circuit according to claim 6, wherein said reference unit is divided into a plurality of reference sub-units, a number of said reference sub-units being equal to a number of said memory half-matrix subsections.

8. The circuit according to claim 7, wherein said propagation delay reproduction unit is structurally identical to each one of said reference sub-units, a single propagation delay reproduction unit being associated with said plurality of reference sub-units.

9. The circuit according to claim 1, further comprising:
for each one of said at least two memory half-matrices, means for the selection/deselection of said reference and propagation delay reproduction units,
said selection/deselection means being driven by a read address transition signal of the memory device and by a signal for selection of one of said at least two memory half-matrices in which the memory cell to be read is selected, and being suitable to simultaneously activate/ deactivate, by means of a common line, said reference and propagation delay reproduction units.

10. The circuit according to claim 1, further comprising propagation selection means for selecting an output of said propagation delay reproduction unit at an intermediate point or at an end point of said propagation reproduction unit, in order to activate the read circuits.

11. The circuit according to claim 10, further comprising means for detecting an end of propagation, said propagation end detection means to trigger said read circuits and receiving, as input, a signal from said propagation delay reproduction unit, said propagation end detection means being correlated to a supply voltage level present in said memory device.

12. The circuit according to claim 1, wherein said reference unit comprises an elevator structure to drive an RC structure, said elevator structure being supplied with a supply voltage of the memory device.

13. The circuit according to claim 12, further comprising means for a quick deselection of said reference unit, said quick deselection means connecting said RC structure to ground to restore pre-activation conditions.

14. The circuit according to claim 1, wherein said propagation delay reproduction unit comprises an elevator structure to drive an RC structure, said elevator structure being supplied with a supply voltage of the memory device.

15. The circuit according to claim 14, further comprising means for quickly deselecting said propagation delay reproduction unit, said quick deselection means connecting said RC structure temporarily to ground to restore pre-activation conditions.

16. The circuit according to claim 9, further comprising means for producing said signals for the selection of said at least two memory half-matrices, said signals being sent to said means for the selection/deselection of said reference and propagation delay reproduction units.

17. The circuit according to claim 16, wherein said means for producing said signals for the selection of said at least two memory half-matrices comprise: an elevator structure, said elevator structure being supplied with a supply voltage of the memory device.

18. The circuit according to claim 10, wherein said means for the selection/deselection of said reference and propagation delay reproduction units comprise an elevator structure, a NOR gate, and two inverters, said elevator structure being supplied with a supply voltage of the memory device.

19. The circuit according to claim 11, wherein said means for detecting the end of propagation comprise an elevator structure that is supplied with the supply voltage of the memory device.

20. A method for reading a memory device, comprising the steps of:
(a) selecting a memory cell of a word line in one of at least two memory half-matrices into which said memory device is divided;
(b) selecting, in a reference unit, a virgin reference memory cell that is connected to a bit line that positionally matches the selection of said memory cell, but which is located in a domain of an other one of said at least two memory half-matrices;
(c) activating, simultaneously with said reference memory cell, a propagation delay reproduction unit to reproduce the propagation delay of said word line and of said reference unit; and
(d) detecting an end of said propagation delay to determine a moment of activation of circuits for reading said memory device.

21. The method according to claim 20, wherein step (c) is provided in synchronization with timing signals of the memory device, said activation being provided synchronously with an end of a pulsed read address transition signal.

22. The method according to claim 20, wherein step (b) is provided synchronously with the selection of said memory cell in the half-matrix that is opposite to the one in which said memory cell is selected, said selection being performed synchronously with an end of a pulsed read address transition signal.

23. A reference word line and data propagation reproduction circuit, comprising:

a first selection/deselection circuit having a first output;

a first reference line coupled to the first output of the first selection/deselection circuit;

a first propagation delay reproduction line coupled to the first output of the first selection/deselection circuit;

a propagation delay selecting circuit coupled to the first propagation delay reproduction line; and a propagation end detecting circuit coupled to the propagation delay selecting circuit.

24. The circuit as recited in claim 23, wherein the first reference line comprises:

at least one circuit segment comprising a driver having an input coupled to the first output of the first selection/deselection circuit and an RC network coupled to an output of the driver.

25. The circuit as recited in claim 23, wherein the first propagation delay reproduction line comprises:

a driver having an input coupled to the first output of the first selection/deselection circuit; and a first RC network coupled to an output of the driver.

26. The circuit as recited in claim 25, wherein the first propagation delay reproduction line further comprises:

a second RC network coupled to the first RC network at a first node;

a first output coupled to the second RC network and to the propagation delay selecting circuit; and a second output coupled to the first node and to the propagation delay selecting circuit.

27. The circuit as recited in claim 24, wherein the driver comprises:

a first transistor with a control lead coupled to the first output of the first selection/deselection circuit, a second lead coupled to ground and a third lead;

a first inverter having an input coupled to the control lead of the first transistor and an output;

a second transistor having a control lead coupled to the output of the first inverter, a second lead coupled to ground and a third lead;

a third transistor having a control lead coupled to the third lead of the first transistor, a second lead coupled to a power supply line and a third lead coupled to the third lead of the second transistor;

a fourth transistor having a control lead coupled to the third lead of the second transistor, a second lead coupled to the power supply line and a third lead coupled to the third lead of the first transistor; and a second inverter having an input coupled to the third lead of the second transistor and an output.

\* \* \* \* \*